(12) United States Patent
Shimodaira et al.

(10) Patent No.: US 7,057,331 B2
(45) Date of Patent: Jun. 6, 2006

(54) PIEZOELECTRIC OSCILLATOR, PORTABLE TELEPHONE UNIT USING PIEZOELECTRIC OSCILLATOR, AND ELECTRONIC EQUIPMENT USING PIEZOELECTRIC OSCILLATOR

(75) Inventors: Kazuhiko Shimodaira, Minowa-machi (JP); Yukari Nakajima, Okaya (JP); Yugo Koyama, Ina (JP); Katsuhiko Miyazaki, Minowa-machi (JP)

(73) Assignee: Seiko Epson Corporation, Tokyo (JP)

( * ) Notice: Subject to any disclaimer, the term of this patent is extended or adjusted under 35 U.S.C. 154(b) by 125 days.

(21) Appl. No.: 10/797,196

(22) Filed: Mar. 11, 2004

(65) Prior Publication Data

US 2004/0245895 A1 Dec. 9, 2004

(30) Foreign Application Priority Data

Mar. 13, 2003 (JP) .............................. 2003-068323
Jan. 6, 2004 (JP) .............................. 2004-001219

(51) Int. Cl.
*H01L 41/08* (2006.01)
(52) U.S. Cl. ...................................... 310/344; 310/348
(58) Field of Classification Search ................ 310/340, 310/344, 348
See application file for complete search history.

(56) References Cited

U.S. PATENT DOCUMENTS 5,541,557 A * 7/1996 Ikeda et al. .................. 331/158
5,631,609 A * 5/1997 Oka et al. ..................... 331/68
5,912,592 A 6/1999 Kikushima
6,229,249 B1 * 5/2001 Hatanaka et al. ............ 310/348
6,703,768 B1 * 3/2004 Kageyama et al. ......... 310/344
6,798,121 B1 * 9/2004 Nakatani et al. ............ 310/340
6,833,654 B1 * 12/2004 Rubach ....................... 310/344
6,917,142 B1 * 7/2005 Koyama et al. ............ 310/344
2002/0084858 A1 7/2002 Luff

FOREIGN PATENT DOCUMENTS

| JP | 01-135214 | 5/1989 |
|---|---|---|
| JP | U 2-4312 | 1/1990 |
| JP | A 4-259104 | 9/1992 |
| JP | 04-334202 | 11/1992 |
| JP | A 9-162345 | 6/1997 |
| JP | A 11-284441 | 10/1999 |

OTHER PUBLICATIONS

Ueta, "Mobilecom Demands Surface-Mountable Crystal Units", IEE Journal of Electronic Engineering, vol. 30, No. 317, May, 1993, pp. 66-68.

* cited by examiner

*Primary Examiner*—Mark Budd
(74) *Attorney, Agent, or Firm*—Oliff & Berridge, PLC (57) ABSTRACT

To provide a piezoelectric oscillator in which the size in the thickness direction can be made smaller and the space required for mounting can be made smaller, and a portable telephone and electronic equipment using the piezoelectric oscillator, a resonator package accommodating a piezoelectric resonating element therein, and an IC chip fixed onto a rear surface of the resonator package and having an oscillating circuit therein are provided, and an inner lead portions of a lead frame are fixed onto the rear surface of the resonator package and the resonator package and the IC chip are resin molded except for an outer lead portion of the lead frame.

7 Claims, 7 Drawing Sheets

PIEZOELECTRIC OSCILLATOR, PORTABLE TELEPHONE UNIT USING PIEZOELECTRIC OSCILLATOR, AND ELECTRONIC EQUIPMENT USING PIEZOELECTRIC OSCILLATOR

BACKGROUND OF THE INVENTION

1. Field of Invention

The present invention relates to a piezoelectric oscillator, including a piezoelectric resonator package accommodating a piezoelectric resonating element and a semiconductor device having a built-in oscillating circuit to oscillate the piezoelectric resonating element, and a portable telephone and electronic equipment using the piezoelectric oscillator.

2. Description of Related Art

In compact information equipment, such as an HDD (Hard Disk Drive), a mobile computer, or an IC card, and mobile communication equipment, such as a portable telephone, a car phone, or a paging system, a piezoelectric oscillator is widely used within the package. In the structure of a related art piezoelectric oscillator, a piezoelectric resonator unit and a oscillating circuit unit are respectively constituted by separate packages. For example, a structure in which the package constituting the piezoelectric resonator unit is overlapped with the package constituting the oscillating circuit unit and fixed thereon is disclosed in the related art. See Microfilm of Publication of Utility Model Application No. H02-4312. Such a structure can avoid various disadvantages when the piezoelectric resonating element and the oscillating circuit are accommodated within the same package. Specifically, there are some cases where gas, generated when curing, adheres to the piezoelectric resonating element and leads to degradation if the piezoelectric resonating element and the oscillating circuit are accommodated within the same resin package.

Therefore, as described above, by accommodating the piezoelectric resonating element and the oscillating circuit in separate packages and overlapping them in the longitudinal direction, these disadvantages can be avoided and the oscillator can be constructed smaller. Recently, in various equipment equipped with a piezoelectric oscillator, further miniaturization becomes a challenge, and thus, the piezoelectric oscillator itself is needed to be formed smaller.

Figure 12:
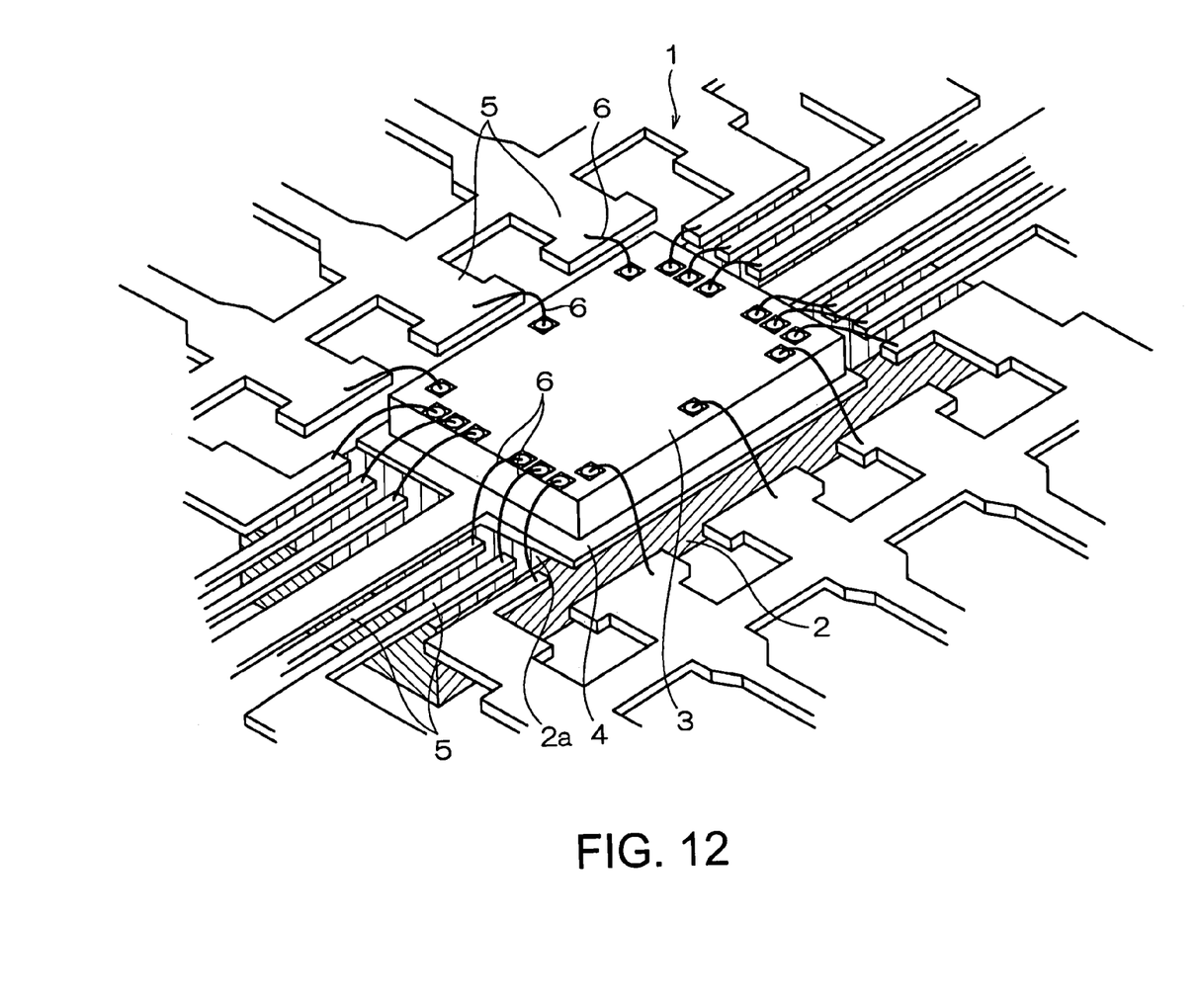
FIG. 12 is a schematic perspective view showing a part of the manufacturing process of a related art piezoelectric oscillator.

Therefore, the piezoelectric oscillator having the constitution in which the piezoelectric resonating element and the oscillating circuit are accommodated in separate packages and overlapped in the longitudinal direction as described above is constructed, for example, as shown in FIG. 12.

FIG. 12 is a schematic showing a process during the manufacture of the above described related art piezoelectric oscillator. In the drawing, a lead frame 1 is fixed onto one surface 2a of a resonator package 2 accommodating a piezoelectric resonating element therein. The lead frame 1 includes a device mounting portion 4 and an IC chip 3 is fixed onto the device mounting portion 4. The respective terminals of the IC chip 3 are wire-bonded to plural inner lead portions 5 included in the lead frame 1 using bonding wires 6.

SUMMARY OF THE INVENTION

Figure 11:
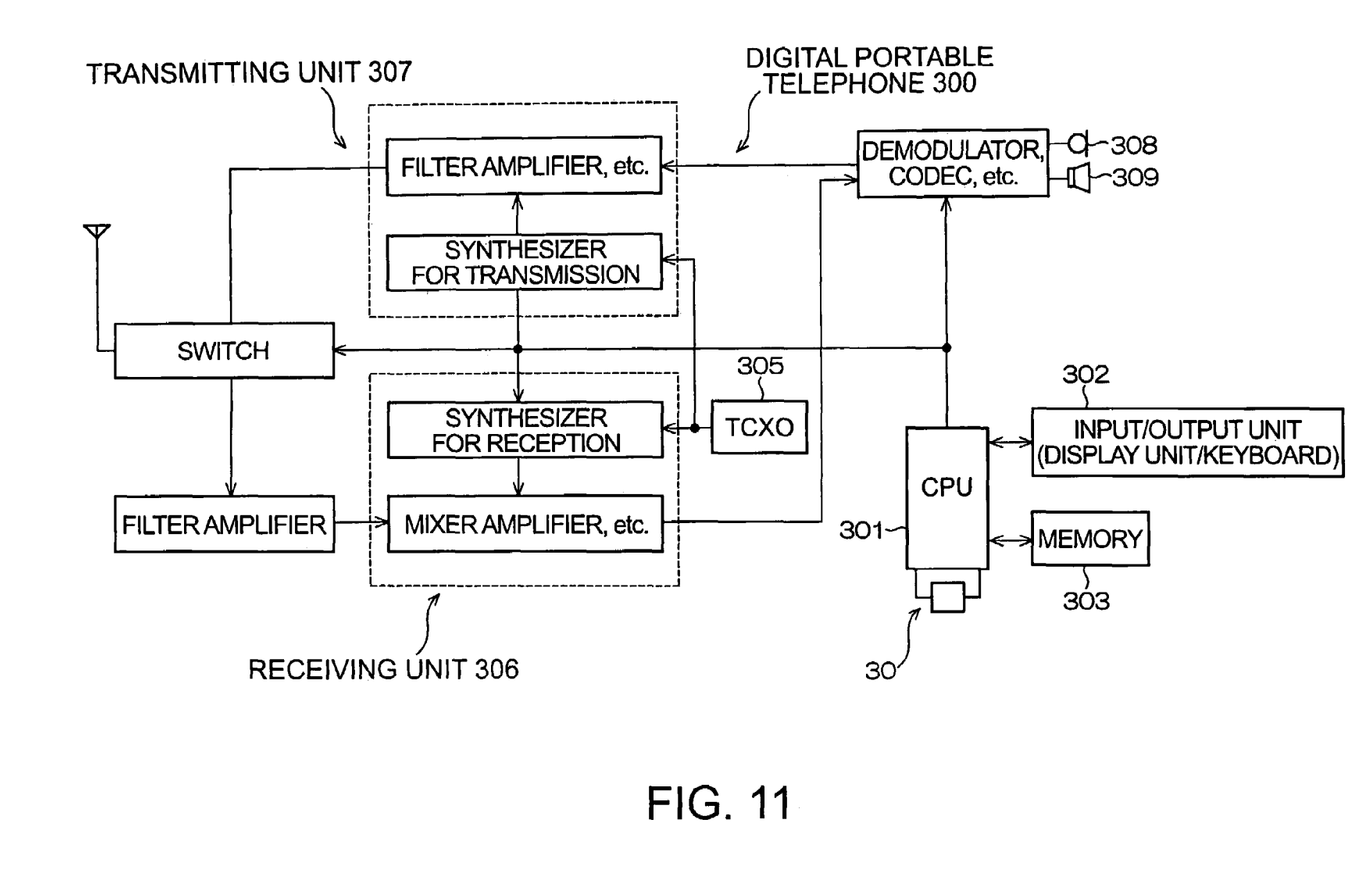
FIG. 11 is a view showing a schematic constitution of a digital portable telephone unit as an example of electronic equipment applying the piezoelectric oscillator according to the exemplary embodiments of the invention.

However, in the piezoelectric oscillator as in FIG. 11, because the lead frame 1 is fixed onto the one surface 2a of the resonator package 2, and the IC chip 3 is fixed onto the device mounting portion 4 of the lead frame 1, the entire thickness becomes larger. The present invention provides a piezoelectric oscillator in which the size in the thickness direction can be made smaller and the space required for mounting can be made smaller and a portable telephone and an electronic equipment using the piezoelectric oscillator.

According to a first aspect of the invention, the above is achieved by a piezoelectric oscillator including a resonator package accommodating a piezoelectric resonating element therein, and a semiconductor device fixed onto a rear surface of the resonator package and having a built-in oscillating circuit. The piezoelectric oscillator is characterized in that an inner lead portion of a lead frame is fixed onto the rear surface of the resonator package and the resonator package and the semiconductor device are resin molded except for an outer lead portion of the lead frame.

According to the construction of an aspect of the invention, the semiconductor device having the built-in oscillating circuit is fixed onto the rear surface of the resonator package. The inner lead portion of the lead frame is further fixed onto the rear surface. Because the semiconductor device and the inner lead portion are fixed onto the same surface of the resonator package and the inner lead portion does not project toward the front surface side of the resonator package by the thickness thereof, the entire thickness can be constructed thinner. Thereby, a piezoelectric oscillator, in which the size in the thickness direction can be made smaller and the space required for mounting can be made smaller is provided.

An aspect of the invention is characterized in that, in the construction of the first invention, the rear surface of the resonator package has a larger area than a bonded surface of the semiconductor device fixed onto the rear surface and the inner lead portion is fixed by using an exposed surface, exposed in a state in which the semiconductor device is fixed onto the rear surface.

According to the construction of this aspect of the invention, because a construction, in which the inner lead portion is fixed by effectively using a region which is distanced from the region where the semiconductor device is fixed in the rear surface of the resonator package, is adopted, the thickness of the inner lead portion is absorbed dimensionally in the thickness of the semiconductor device and a piezoelectric oscillator having a thin thickness can be formed easily.

An aspect of the invention is characterized in that, the resonator package is sealed by a metal lid body and a terminal conducted to the lid body is provided on the rear surface of the resonator package. The terminal conducted to the lid body and the inner lead portion connected to the semiconductor device are electrically coupled and fixed by being made in contact with each other.

According to the construction of this aspect of the invention, the piezoelectric oscillator can be shielded easily by electrically coupling the ground terminal of the semiconductor device to the terminal conducted to the metal lid body of the resonator package.

An aspect of the invention is characterized in that, on the rear surface of the resonator package, a terminal connected to the piezoelectric resonating element accommodated in the resonator package is provided. The inner lead portion connected to the semiconductor device is fixed in a state of being insulated from the terminal. The terminal connected to the piezoelectric resonating element and an oscillating circuit terminal of the semiconductor device are connected by wire-bonding.

According to the construction of this aspect of the invention, the connection between the terminal connected to the piezoelectric resonating element and the semiconductor device is carried out by wire-bonding. Therefore, the stray capacitance can be made smaller by carrying out the connection to the piezoelectric resonating element not via the inner lead portion.

An aspect of the invention is characterized in that, in the construction of any one of the first to third aspects, on the rear surface of the resonator package, a terminal connected to the piezoelectric resonating element accommodated in the resonator package is provided. The inner lead portion connected to the semiconductor device is in a state of being insulated from the terminal by being arranged so as not to overlap two-dimensionally with the terminal. The terminal and an oscillating circuit terminal of the semiconductor device are connected by wire-bonding.

According to the construction of this aspect of the invention, because the inner lead portion is arranged so as not to overlap two-dimensionally with the terminal, the insulated state between the inner lead portion and the terminal can be further assured by providing a space between the inner lead portion and the terminal so they may not contact each other and the stray capacitance is smaller.

An aspect of the invention is characterized in that, in the construction of any one of the previous aspects of the invention, the piezoelectric oscillator is resin molded except a region at the center part of the lid body of the resonator package.

According to the construction of this aspect of the invention, only the semiconductor device, the inner lead portion, side surfaces of the resonator package and the bonded region of the resonator package and the lid body are resin molded. Therefore, because the most part of the lid body of the resonator package is exposed out of the resin molded portion, the heat dissipation of the heat generated by driving the semiconductor constituting the oscillating circuit can be accelerated. Further, in the case where the lid body is formed from a light transmissive material, such as glass, by not covering the lid body with resin, frequency adjustment can be carried out by applying a laser beam or the like via the lid body to the internal piezoelectric resonating element.

In addition, according to an aspect of the invention, the above is achieved by a portable telephone unit applying a piezoelectric oscillator including a resonator package accommodating a piezoelectric resonating element therein and a semiconductor device fixed onto a rear surface of the resonator package and having a built-in oscillating circuit. The portable telephone unit is characterized in that a control clock signal is obtained by the piezoelectric oscillator, in which an inner lead portion of a lead frame is fixed onto the rear surface of the resonator package. The resonator package and the semiconductor device are resin molded except an outer lead portion of the lead frame.

Moreover, according to an aspect of the invention, the above is achieved by electronic equipment applying a piezoelectric oscillator including a resonator package accommodating a piezoelectric resonating element therein, and a semiconductor device fixed onto a rear surface of the resonator package and having a built-in oscillating circuit. The electronic equipment is characterized in that a control clock signal is obtained by the piezoelectric oscillator in which an inner lead portion of a lead frame is fixed onto the rear surface of the resonator package. The resonator package and the semiconductor device are resin molded except an outer lead portion of the lead frame.

DETAILED DESCRIPTION OF EXEMPLARY EMBODIMENTS

Figure 1:
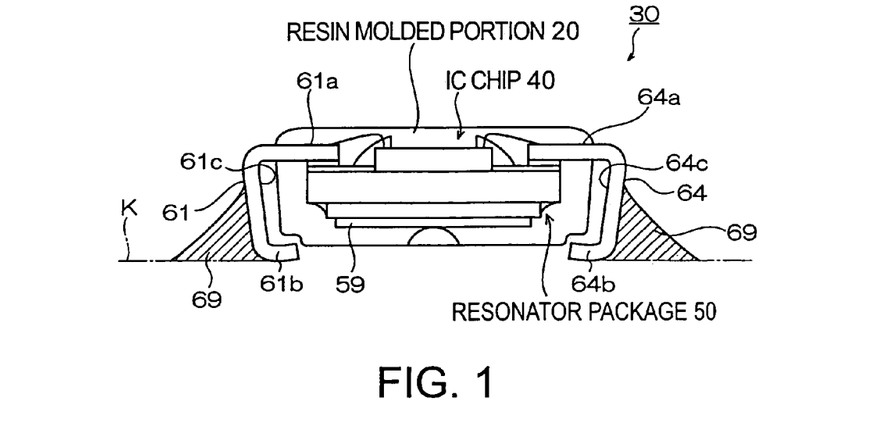
FIG. 1 is a schematic side view showing the first exemplary embodiment of a piezoelectric oscillator of the invention.
Figure 2:
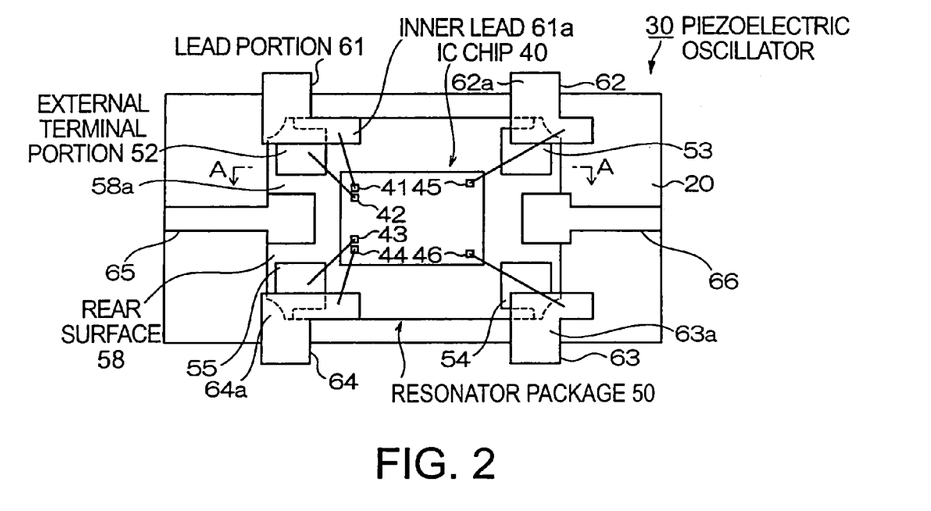
FIG. 2 is a schematic plan view of the piezoelectric oscillator in FIG. 1.
Figure 3:
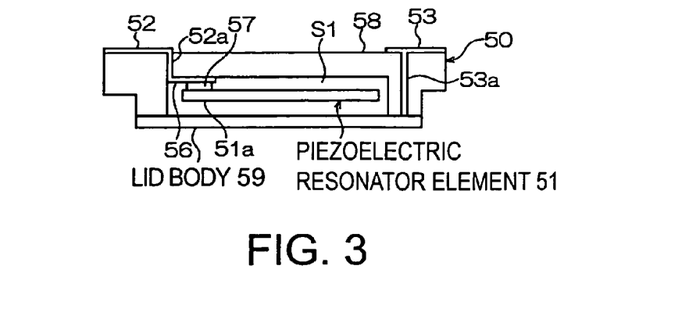
FIG. 3 is a schematic sectional view along plane A—A of FIG. 2.

FIGS. 1 to 3 show the first exemplary embodiment of a piezoelectric oscillator of the invention. FIG. 1 is a schematic side view (left side view) of the piezoelectric oscillator, FIG. 2 is a schematic plan view of the piezoelectric oscillator and FIG. 3 is a schematic sectional view along plane A of FIG. 2. Note that, in FIG. 1, the internal construction is shown by making a resin molded portion transparent for convenience of understanding.

In the drawings, a piezoelectric oscillator 30 includes a resonator package 50 accommodating a piezoelectric resonating element and an IC chip 40 that is a semiconductor device fixed to the rear surface of the resonator package 50 and having a built-in oscillating circuit.

As shown in FIG. 3, the resonator package 50 is formed by laminating plural base materials, formed by shaping ceramic green sheets made of aluminum oxide, for example, as an insulating material, and then sintering them.

Some base materials have a predetermined internal space S1 inside when laminated by forming the predetermined holes inside thereof. The package is formed in the form of an opened rectangular box. A piezoelectric resonating element 51 is accommodated in the internal space S1. As shown in FIG. 3, an electrode portion 56, formed by, for example, nickel plating and gold plating on metallized tungsten, is provided so as to be exposed to the internal space S1 near the left end of the bottom of the resonator package 50 (the top and bottom is reversely shown in FIG. 3). As for the electrode portion 56, the electrode portions having the same form, though not shown in the drawing, are formed near both ends in the width direction of the resonator package 50 in FIG. 2 (in the vertical direction in the drawing).

The electrode portion 56 in FIG. 3 is connected to an external terminal portion 52 shown in FIG. 2 of the resonator package 50. Similarly, the above described other electrode portion, that is not shown, is connected to an external terminal portion 55 shown in FIG. 2 of the resonator package 50. The electrode portion 56 and the other not shown electrode portion are electrically coupled to the IC chip 40, in a manner as described later, to supply a driving voltage to the piezoelectric resonating element 51. As shown in FIG. 3, a conductive adhesive 57 is applied to the surface of the electrode portion 56 and a lead electrode portion (not shown) of a base portion 51a of the piezoelectric resonating element 51 is mounted on the surface of the conductive adhesive 57 and bonded by curing the conductive adhesive 57.

Note that the other not shown electrode portion is also applied with the conductive adhesive 57 and bonded to the lead electrode portion for driving the piezoelectric resonating element 51. As for the conductive adhesive 57, an adhesive made by including conductive particles, such as silver fine particles in a synthetic resin agent as an adhesive component that exerts bonding force can be used. Silicone, epoxy, or polyimide conductive adhesives or the like can be used. The piezoelectric resonating element 51 is formed from quartz, for example, and a piezoelectric material, such as lithium tantalate and lithium niobate can also be used other than quartz. In the case of the exemplary embodiment, as for the piezoelectric resonating element 51, for example, a so-called AT cut resonating element formed by cutting a quartz wafer into rectangular shape along a prescribed direction or a resonating element in the form of a tuning fork can be used.

The piezoelectric resonating element 51 is provided with an excitation electrode as an electrode for driving and the above described lead electrode, connected to the excitation electrode and formed by leading on the bonding end of the piezoelectric resonating element 51 on the surface thereof.

In FIG. 3, a lid body 59 is to seal air-tight the piezoelectric resonating element 51 within the internal space S1 and a plate-formed lid body is used in the exemplary embodiment. By using a wax material (not shown), the lid body 59 is fixed to the opening end of the resonator package 50 to seal it. As for the lid body 59, conductive metal, such as a metallic alloy of Fe—Ni—Co can be preferably used. The lid body is connected to the external terminal portion 53, formed by being exposed on the rear surface 58 of the resonator package 50 (the front side surface shown in FIG. 2 and the top surface in FIG. 3), by a conductive portion 53a.

Further, in FIG. 2, the external terminal portion 54, formed by being exposed on the rear surface 58 of the resonator package 50 is also connected to the lid body 59 by the same structure. In the exemplary embodiment, with the structure described as below, the shield effect can be provided by grounding the lid body 59 using the external terminal 54.

Next, the IC chip 40 as a semiconductor device is to accommodate the oscillating circuit formed by an integrated circuit (not shown) inside thereof. The IC chip 40 is fixed to the rear surface 58 of the resonator package 50 (the front side surface shown in FIG. 2 and the top surface in FIG. 3) near the center thereof using an epoxy or silicon adhesive, for example. In this case, as shown in FIG. 2, the rear surface 58 of the resonator package 50 has a larger area than the bonded surface of the IC chip 40, and forms an exposed surface 58a on the periphery of the IC chip 40. On the surface of the IC chip 40, which is opposite to the bonded surface of the resonator package 50, several terminal portions are provided, and six terminal portions of terminal portions 41 to 46 are exposed in FIG. 2. There are some cases where the number of terminal portions is larger or smaller than six depending on types of the IC chip.

As for the exemplary embodiment shown in FIG. 2, the terminal portions 42, 43 of the IC chip 40 are connection terminals to the resonator package 50, for example. The terminal portion 41 is an input/output terminal of the oscillating circuit. The terminal portion 44 is a control terminal, the terminal portion 45 is an output terminal and the terminal portion 46 is a ground terminal. The input/output terminal 41, the connection terminals 42, 43 to the resonator package 50 and the control terminal 44 are arranged along the left end side of the IC chip 40 in FIG. 2. On the other hand, the output terminal 45 and the ground terminal 46 are arranged along the right end side of the IC chip 40 in FIG. 2.

Further, as shown in FIGS. 1 and 2, in the positions that overlap with the external terminal portions 52, 53, 54, 55 on the rear surface 58 of the resonator package 50, inner lead portions 61a, 62a, 63a, 64a of lead portions 61, 62, 63, 64 separated from the lead frame (to be described later) are fixed, respectively. These respective inner lead portions are used such that the inner lead portion 61a is a power supply terminal of the piezoelectric oscillator 30, the inner lead portion 62a is an output terminal of the piezoelectric oscillator 30, the inner lead portion 63a is a ground terminal of the piezoelectric oscillator 30, and the inner lead portion 64a is a control terminal of the piezoelectric oscillator 30. Of the respective inner lead portions, the inner lead portions 61a, 62a, and 64a are fixed in a state of being electrically insulated from the external terminal portions 52, 53, and 55 in the positions that respectively overlap with them and the inner lead portion 63a is fixed in a state of being conducted to the external terminal portion 54 as a ground terminal of the resonator package 50. Additionally, as for the exemplary embodiment shown in FIG. 1, in the lead portions 61, 64, outer end side portions, viewed from the inner lead portions 61a, 64a, are bent downwardly, and the outer lead portions 61b, 64b of the leading ends are bent inwardly at the lower ends.

Further, in FIG. 2, substantially at the center in the width direction of the resonator package 50, auxiliary lead portions 65, 66 to hold the resonator package 50 in the manufacturing process are fixed onto the right and left positions in the drawing.

Figure 4:
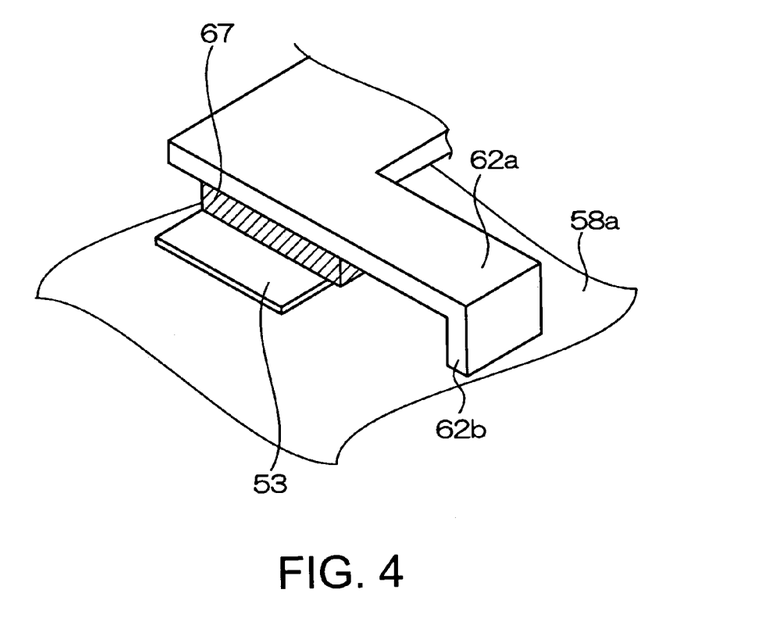
FIG. 4 is a schematic perspective view showing an example of a technique of fixing the inner lead portion and the external terminal portion of the piezoelectric oscillator in FIG. 1 in a state of being electrically insulated.

FIG. 4 shows an example of a technique of fixing the inner lead portion and the external terminal portion in a state of being electrically insulated. In the drawing, an insulative adhesive 67 is applied between the lower surface of the inner lead portion 62a and the external terminal portion 53 of the resonator package 50. By the adhesive 67, the inner lead portion 62a and the external terminal portion 53 are insulated. In this case, preferably, by integrally forming a wall portion 62b extending from the inner lead portion 62a toward the resonator package side, the wall portion 62b serves as a spacer that separates the inner lead portion 62a and the external terminal 53, and thereby, the insulation effect can be assured even more.

Figure 5:
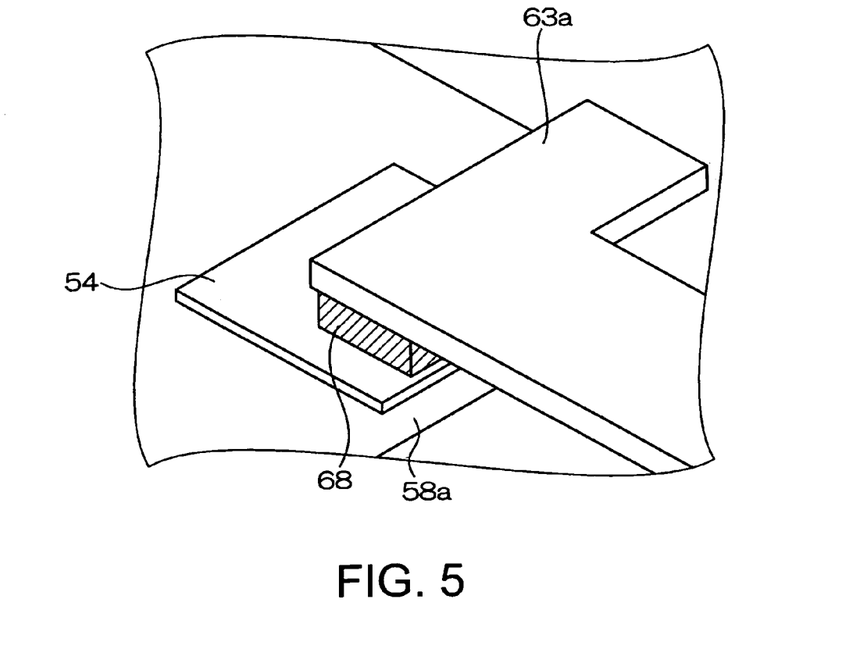
FIG. 5 is a schematic perspective view showing an example of a technique of fixing the piezoelectric oscillator in FIG. 1 in a state of being electrically coupled.

FIG. 5 shows an example of a technique of fixing the inner lead portion and the external terminal portion in the electrically coupled state. In the drawing, a conductive adhesive 68 is applied between the lower surface of the inner lead portion 63a and the external terminal portion 54 as a ground terminal of the resonator package 50. By the adhesive 68, the inner lead portion 63a and the external terminal portion 54 are conducted.

Further, as shown in FIG. 2, the terminal portion 41 of the IC chip 40 is electrically coupled to the inner lead portion 61a and the terminal 42 is electrically coupled to the external terminal 52 of the resonator package 50. In addition, the terminal portion 43 of the IC chip 40 is electrically coupled to the external terminal 55 of the resonator package 50 and the terminal portion 44 is electrically coupled to the inner lead portion 64a.

Furthermore, the terminal portion 45 is electrically coupled to the inner lead portion 62a and the terminal portion 46 is electrically coupled to the inner lead portion 63a. These electrical connections are carried out by wire-bonding using conducting wire such as gold wire, for example, as shown in FIG. 2.

Therefore, the respective terminals of the resonator package 50 and the respective inner lead portions connected to the piezoelectric resonating element 51 are arranged so as not to be connected but insulated in the fixed positions and the respective inner lead portions connected to the IC chip 40 are arranged so as to be connected to the respective terminals of the resonator package 50 by wire-bonding. On this account, because the connection to the piezoelectric resonating element is carried out without via the inner lead portions, the stray capacitance can be reduced.

After such electrical coupling is carried out, resin molding is carried out with synthetic resin so as to coat the components except at least outer lead portions 61b, 64b of the lead portion 61 of FIG. 1. This resin molded portion 20 is provided to insulate the respective terminals, the gold wire of the wire bonding or the like and to protect the internal structure and can be formed by injecting, for example, epoxy resin as synthetic resin having advantageous formability and insulation into the forming die to shape it as shown in the drawings.

The exemplary embodiment is constructed as described above. As shown in FIG. 2, the IC chip 40 is fixed to the rear surface 58 of the resonator package 50, and, to the rear surface 58, the respective inner lead portions 61a, 62a, 63a, 64a of the lead frame are further fixed. That is, because IC chip 40 and the inner lead portions are fixed onto the same surface of the vibration package 50, the inner lead portions 61a, 62a, 63a, 64a do not project toward the front surface side of the resonator package 50 by the thickness thereof, and thereby, the thickness of the entire piezoelectric oscillator 30 can be constructed thinner.

Specifically, because the construction in which the rear surface 58 of the resonator package 50 has a larger area than the bonded surface of the IC chip 40 fixed to the rear surface 58, and the respective inner lead portions 61a, 62a, 63a, 64a are fixed using the exposed surface 58a, which is exposed in the state in which the IC chip 40 is fixed to the rear surface 58 of the resonator package 50, the region to fix the respective inner lead portions 61a, 62a, 63a, 64a and the region to fix the IC chip 40 can be provided suitably on the same surface 58 of the resonator package 50. Thereby, it is assured that the thickness of the inner lead portions 61a, 62a, 63a, 64a are absorbed dimensionally in the thickness of the IC chip 40, and thereby, a piezoelectric oscillator having a thin thickness can be formed.

Further, because the resonator package 50 is sealed by the metal lid body 59, and the external terminal 54 conducted to the lid body 59 is provided on the rear surface 58 of the resonator package 50, the piezoelectric oscillator 30 can be easily shielded. In addition, on the rear surface 58 of the resonator package 50, the external terminal 52 and the external terminal 55 connected to the piezoelectric resonating element 51 accommodated therein are provided. The inner lead portions 61a, 64a are electrically coupled to these terminals. On this account, the electrical connections of the piezoelectric resonating element 51, the IC chip 40, and the piezoelectric oscillator 30 to the external side can be easily carried out.

Further, as shown in FIG. 1, the lead portion 61 and lead portion 64 are bent downwardly from the respective inner lead portions 61a, 64a, which are fixed to the above resonator package 50, and the midway positions 61c, 64c are formed so as to extend along the side surface of the piezoelectric oscillator 30. On this account, in the case where the mounting is carried out on the mounting substrate K or the like using solder, as shown in the drawings, the solder is likely to adhere to the respective midway portions 61c, 64c of the lead portions, respectively, to form fins 69, 69. Thereby, the mounting structure can be reinforced.

Figure 6:
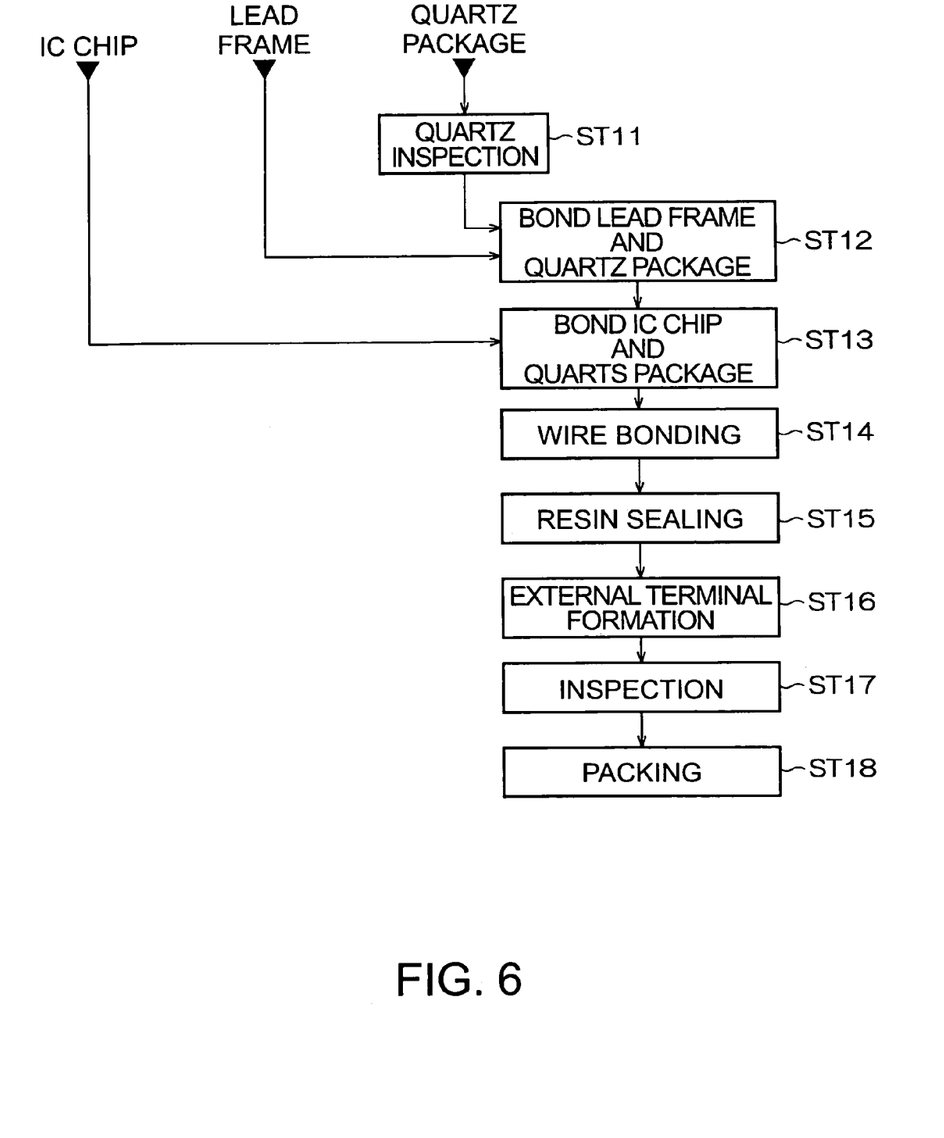
FIG. 6 is a flowchart simply showing an example of the manufacturing process of the piezoelectric oscillator in FIG. 1.

FIG. 6 is a flowchart briefly explaining an example of the manufacturing process of the piezoelectric oscillator 30. As shown in the drawing, at first, as a semiconductor device having a built-in oscillating circuit, for example, a commercially available IC chip, a lead frame to form inner lead portions, and, as the resonator package 50, for example, a quartz package accommodating a quartz resonating element are prepared. The IC chip is not limited to that of commercially available prescribed type, but may be a custom-build chip. Because the position of the external terminal is different when the type is different, in this case, the electrical coupling is needed to be changed as described later. As for the lead frame, a lead frame generally used when manufacturing a package device is used, and a lead frame formed by a Fe alloy, such as a 42 alloy or a Cu alloy, such as Cu—Sn, Cu—Fe, Cu—Zn, Cu—Ni, or a ternary alloy in which the third element is added thereto, for example, is used. The quartz package is the same as the resonator package 50 described in detail in FIG. 3, and the structure thereof is as described above. That is, the package is manufactured by forming necessary electrodes in the ceramic package, for example, bonding the piezoelectric resonating element 51 and then sealing air-tightly by the lid body 59. Subsequently, the resonator package 50 as the quartz package is subjected to its unit inspection required for its vibration frequency or the like (ST11) and followed by the next step.

Figure 7:
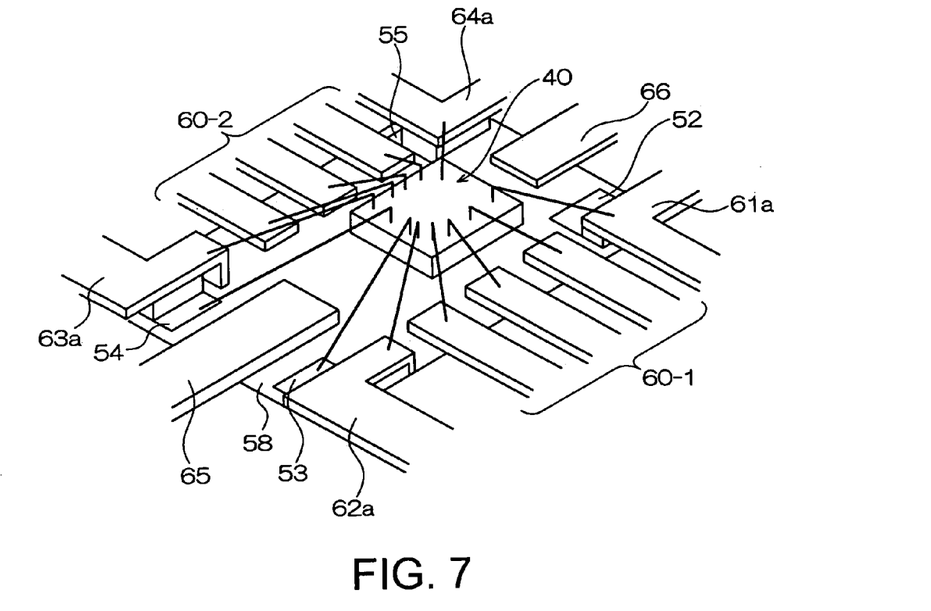
FIG. 7 is a schematic perspective view showing a part of the process of FIG. 6.

FIG. 7 shows a state in which inner lead portions of the lead frame are fixed onto the rear surface 58 of the resonator package (ST12). As shown in the drawing, the number of the inner lead portions fixed onto the rear surface 58 of the resonator package is not limited to the number described in FIG. 2. A large number of lead portions can be fixed as shown by numerals 60-1, 60-2. In this case, by fixing auxiliary lead portions 65, 66, which are arranged in a direction different from the direction in which these inner lead portions extend, for example, in a direction perpendicular to the direction in which the large number of inner lead portions shown by numerals of 60-1, 60-2 extend, to the rear surface 58 of the resonator package, the large number of inner lead portions can be fixed while holding them not to displace. Then, the IC chip 40 is fixed substantially at the center of the rear surface 58 of the resonator package 50 with an adhesive or the like (ST13). Next, as shown in the drawing, the terminal portions of the IC chip 40 and the external terminal portions 52, 53, 54, 55 of the resonator package and the large number of inner lead portions 60-1, 60-2 are electrically coupled by wire-bonding (ST14).

In such a state, it is placed within a forming die (not shown), and the resin molded portion 20 described in FIGS. 1 and 2 is formed by resin mold by injecting mold resin into the die (ST15). Then, using a prescribed jig, as described in FIG. 1, the bending structures of the lead portions 61, 64 are shaped. Thus, the piezoelectric oscillator 30, including predetermined outer lead portions 61b, 64b is formed (ST16). Subsequently, necessary inspection is performed (ST17) and the oscillator is packed (ST18) to bring it into the condition that it can be shipped as a product.

Figure 8:
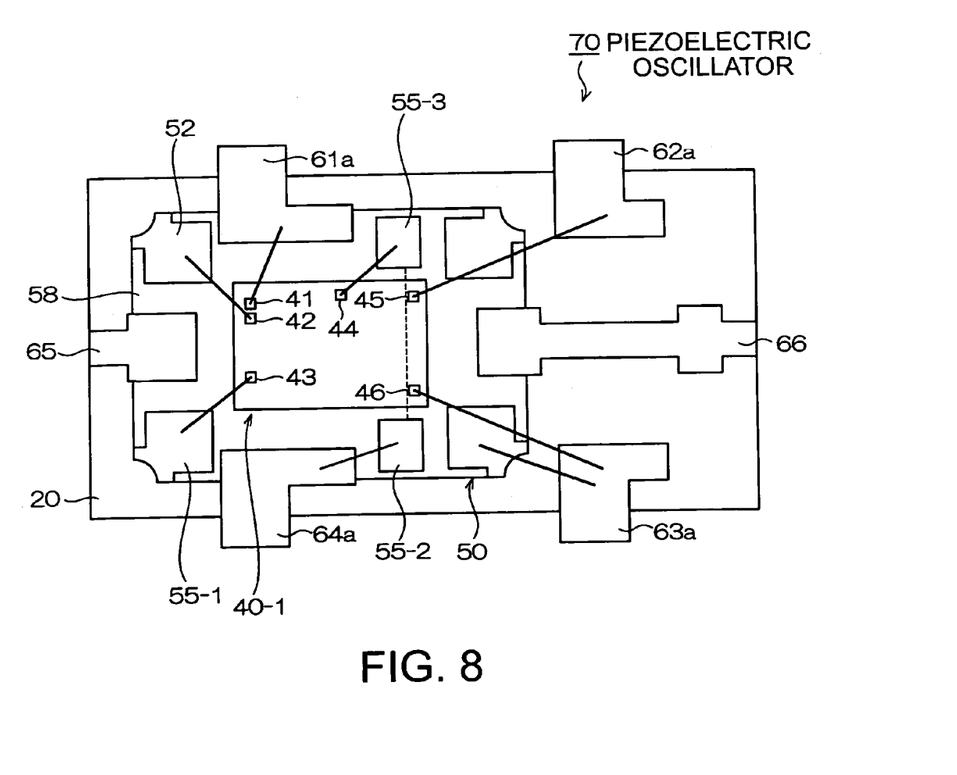
FIG. 8 is a schematic plan view showing the second exemplary embodiment of the piezoelectric oscillator of the invention.

FIG. 8 is a schematic plan view showing a second exemplary embodiment of the piezoelectric oscillator of the invention. Because the parts assigned with the same numerals as used in the first exemplary embodiment are common, overlapping description will be omitted, and the difference will be mainly described as below. A piezoelectric oscillator 70 is different in construction of an IC chip 40-1 to be fixed to the rear surface 58 of the resonator package 50. That is, as compared to FIG. 2, the IC chip 40 and the IC chip 40-1 are different in the arrangement of their terminal portions. In the IC chip 40-1, its input/output terminal 41 and connection terminals 42, 43 to the resonator package 50 are arranged along the left end side of the IC chip 40, which are the same as the case of the first exemplary embodiment.

However, the difference is in the point that the control terminal 44 is disposed slightly near the center of the upper end side of the IC chip 40-1, as shown in FIG. 8. In addition, the output terminal 45 and the ground terminal 46 are arranged along the right end side of the IC chip 40-1 in FIG. 8. In response to the difference in construction of the IC chip 40-1, on the rear surface 58 of the resonator package 50, the same terminal as in the external terminal portion 55 of the first exemplary embodiment is provided as a first external terminal portion 55-1 in the same position as in the first exemplary embodiment. Further, a second external terminal portion 55-2 conducted to the first external terminal portion 55-1 within the package is exposed near the right of the lower end side of the resonator package 50 in FIG. 8.

Moreover, a third external terminal 55-3 conducted to the second external terminal portion 55-2 within the package is exposed near the right of the upper end side of the resonator package 50 in FIG. 8. In this case, as shown in the drawing, the connection terminal 43 of the IC chip 40-1 is connected to the first external terminal portion 55-1 of the resonator package 50 by wire-bonding or the like. The inner lead portion 64a is connected to the second external terminal portion 55-2 by wire-bonding or the like. The connection terminal 44 of the IC chip 40-1 is connected to the third external terminal portion 55-3 of the resonator package 50 by wire-bonding or the like.

Thereby, as in the first exemplary embodiment, the necessary electrical coupling between the IC chip 40-1 and the resonator package 50 can be carried out by wire-bonding the respective connection terminals of the IC chip 40-1 to the external terminal portions and the inner lead portion arranged on the periphery thereof. That is, by exposing the necessary number of terminals connected to the piezoelectric resonating element 51 on the rear surface 58 of the resonator package 50, the IC chip having a different terminal arrangement can be used.

Figure 9:
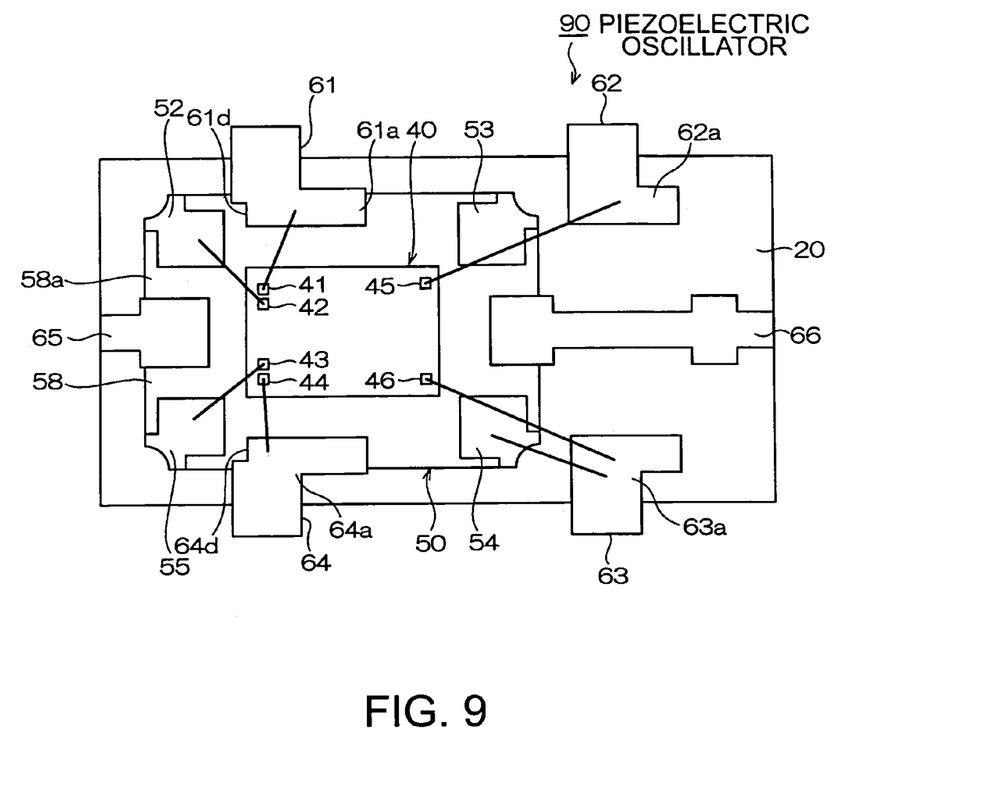
FIG. 9 is a schematic plan view showing the third exemplary embodiment of the piezoelectric oscillator of the invention.

FIG. 9 is a schematic plan view showing a third exemplary embodiment of the piezoelectric oscillator of the invention. Because the parts assigned with the same signs as used in the first exemplary embodiment are common, an overlapping description will be omitted and the difference will be mainly described as below. A piezoelectric oscillator 90 is mainly different in arranged positions and forms of the inner lead portions 61a, 62a, 63a, 64a from the first exemplary embodiment.

That is, in the piezoelectric oscillator 90, the inner lead portions 61a, 62a, 63a, 64a are arranged so as not to overlap two-dimensionally with the external terminal portions 52, 55, which are electrically coupled to the piezoelectric resonating element 51 within the resonator package 50. Specifically, arrangement of the inner lead portions 61a, 62a, 63a, 64a are two-dimensionally shifted so that the respective principal surfaces thereof may not overlap with the principal surfaces of the external terminal portions 52, 55, which are electrically coupled to the piezoelectric resonating element 51 and the inner lead portions 61a, 62a, 63a, 64a may not contact the external terminal portions 52, 55.

Further, the inner lead portions 61a, 64a have notch portions 61d, 64d so as to take a longer distance to the external terminal portions 52, 55 in the horizontal direction within the limited range of the rear surface 58 of the resonator package 50. The notch portions 61d, 64d are formed so as to have forms that avoid the outline of the adjacent external terminal portions 52, 55, as shown in the drawing.

Note that the inner lead portions 62a, 63a may be arranged so as to overlap two-dimensionally with the external terminal portions 53, 54. However, in the third exemplary embodiment, the inner lead portions 62a, 63a are arranged so as not to overlap two-dimensionally with the external terminal portions 53, 54 in order to suppress the thickness of the piezoelectric oscillator 90.

In addition, because the inner lead portions 61a, 64a are arranged so as not to overlap two-dimensionally with the external terminal portions 52, 55, respectively, in order to avoid the contact with the external terminal portions 52, 55, as for the adhesive to fix them to the rear surface 58 of the resonator package 50, there is no need to use the insulative adhesive 67 (see FIG. 4) as in the first exemplary embodiment, and an conductive adhesive may also be used. The piezoelectric oscillator 90 according to the third exemplary embodiment of the invention is constructed as described above, and thereby, exerts the same operation and effect as those in the first exemplary embodiment.

Further, the inner lead portions 61a, 62a, 63a, 64a are arranged so as not to overlap two-dimensionally with the external terminal portions 52, 55. Thereby, the respective distances between the inner lead portions 61a, 64a and the external terminal portions 52, 55 can be taken larger than in the first exemplary embodiment, the electrical insulation between the inner lead portions 61a, 64a and the external terminal portions 52, 55 can be more assured, and the stray capacitance can be made smaller.

Especially, in FIG. 9, because the inner lead portions 61a, 64a have the notch portions 61d, 64d, the distances between the end surfaces of the inner lead portions 61a, 64a and the end surfaces of the external terminal portions 52, 55 can be taken even larger, the electrical insulation between the inner lead portions 61a, 64a and the external terminal portions 52, 55 can be even more assured, and the stray capacitance can be made even smaller.

By the way, the terminal portion 44 of the IC chip 40 in FIG. 9 is disposed near the inner lead portion 64a. On this account, there is no need to provide the external terminal portions 55-2, 55-3 in the resonator package 50 and connect these external terminal portions and the inner lead portion 64a as in FIG. 8 in the second exemplary embodiment, and the stray capacitance can be made smaller as compared to the piezoelectric oscillator 70 in FIG. 8.

Figure 10:
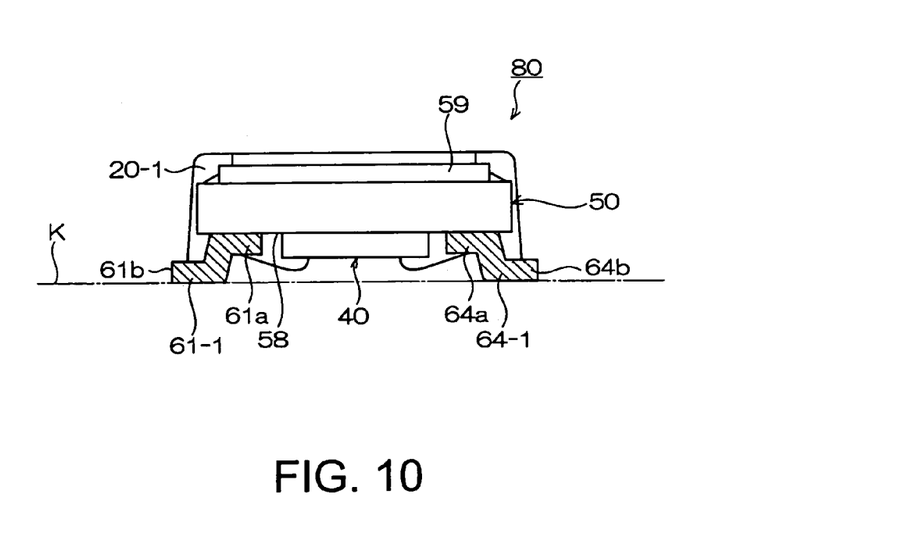
FIG. 10 is a schematic side view showing the fourth exemplary embodiment of the piezoelectric oscillator of the invention.

FIG. 10 is a schematic side view showing a fourth exemplary embodiment of the piezoelectric oscillator of the invention. Because the parts assigned with the same numerals as used in the first exemplary embodiment are common, overlapping description will be omitted, and the difference will be mainly described as below. A piezoelectric oscillator 80 is different in forms of the lead portions to be fixed to the rear surface 58 of the resonator package 50. Further, the coating range of the resin molded portion 20-1 is different. That is, the resin molded portion 20-1 is coated except the region at the center part of the lid body 59 of the resonator package 50. Thereby, only the IC chip 40, the inner lead portions 61a, 64a, side surfaces of the resonator package 50, and the bonded region of the resonator package 50 and the lid body 59 are resin molded.

By such construction, because the greater part of the lid body 59 of the resonator package 50 is exposed out of the resin molded portion 20-1, the heat dissipation of the heat generated by driving the semiconductor constituting the oscillating circuit can be accelerated. Further, in the case where the lid body 59 is formed from a light transmissive material, such as glass, by not covering the lid body 59 with resin, frequency adjustment can be carried out by applying a laser beam or the like via the lid body to the internal piezoelectric resonating element (not shown).

In addition, in FIG. 10, the resonator package 50 is disposed with the rear surface 58 directed downward, which is reverse to that in the case of FIG. 1. The respective lead portions 61, 64 fixed to the downward rear surface 58 are shorter than those in the case of FIG. 1, and bent in the form of a crank. Thereby, because the respective lead portions do not have the structures that project to the sides and come toward the mounting substrate K along the side surfaces of the resonator package 50, as in the case of FIG. 1, the size in the width direction becomes smaller than that of the piezoelectric oscillator 30 in FIG. 1. Accordingly, the mounting space can also be made smaller than that of the piezoelectric oscillator 30 in FIG. 1.

FIG. 11 shows a schematic constitution of a digital portable telephone unit as an example of electronic equipment applying the piezoelectric oscillator according to the above described exemplary embodiments of the invention. In the drawing, the voice of a transmitter converted into an electric signal by a microphone 308 is digitally modulated in a demodulator, codec unit, and frequency converted to RF (Radio Frequency) band in the transmitting unit 307, and then, transmitted via an antenna to the base station (not shown).

Further, the RF signal from the base station is frequency converted in the receiving unit 306, and converted into an audio signal in the demodulator, codec unit, and then, output from a speaker 309. In addition, a CPU (Central Processing Unit) 301 controls the entire operation of the digital portable telephone unit 300 including an input/output unit 302 having a liquid crystal display device and a keyboard. A memory 303 is an information storage device including a RAM, a ROM controlled by the CPU 301, and a control program of the digital portable telephone unit 300 and information, such as a telephone directory, are stored therein. As for an application of the piezoelectric oscillator according to the exemplary embodiments of the invention, for example, there is a TCXO (Temperature Compensated X'stal Oscillator) 305.

The TCXO 305 is a piezoelectric oscillator in which the frequency variation due to ambient temperature change is reduced, and widely used in the portable telephone unit as a frequency reference source of the receiving unit 306 and the transmitting unit 307 in FIG. 11. Because the demand for miniaturization of the TCXO 305 becomes higher with the recent miniaturization of the portable telephone unit, the miniaturization of the TCXO by the structure according to the exemplary embodiments of the invention is extremely effective.

As described above, using the piezoelectric oscillator 30, the piezoelectric oscillator 70, the piezoelectric oscillator 80, and the piezoelectric oscillator 90 according to the above described exemplary embodiments for the electronic equipment, such as the digital portable telephone unit 300 makes the size in the width direction smaller, and thereby, they can contribute to the entire miniaturization of the digital portable telephone unit 300. The present invention is not limited to the above described exemplary embodiments. The respective constructions of the respective exemplary embodiments and the respective modified examples can be suitably combined with each other, and combined with other constructions, which descriptions are omitted and not shown.

What is claimed is:

1. A piezoelectric oscillator, comprising:
a resonator package accommodating a piezoelectric resonating element in the piezoelectric oscillator; and
a semiconductor device fixed onto a rear surface of the resonator package and having a built-in oscillating circuit,
an inner lead portion of a lead frame fixed onto the rear surface of the resonator package and the resonator package and the semiconductor device being resin molded, except an outer lead portion of the lead frame, the inner lead portion and the semiconductor device connected by wire bonding,
on the rear surface of the resonator package, a terminal connected to the piezoelectric resonating element accommodated in the resonator package being provided, the inner lead portion connected to the semiconductor device being fixed in a state of being insulated from the terminal and the terminal connected to the piezoelectric resonating element and an oscillating circuit terminal of the semiconductor device connected by wire-bonding,
a terminal of the semiconductor element connected to the inner lead portion and a terminal of the semiconductor element connected to a terminal connected to the piezoelectric oscillation piece are arranged on a surface opposite to a surface joining the resonator package of the semiconductor device.

2. The piezoelectric oscillator according to claim 1, the rear surface of the resonator package having a larger area than a bonded surface of the semiconductor device fixed onto the rear surface and the inner lead portion fixed by using an exposed surface exposed in a state in which the semiconductor device is fixed onto the rear surface.

3. The piezoelectric oscillator according to claim 1, the resonator package sealed by a metal lid body, and a terminal conducted to the lid body being provided on the rear surface of the resonator package and the terminal conducted to the lid body and the inner lead portion connected to the semiconductor device being electrically coupled and fixed by being made contact with each other.

4. The piezoelectric oscillator according to claim 1, on the rear surface of the resonator package, a terminal connected to the piezoelectric resonating element accommodated in the resonator package being provided, the inner lead portion connected to the semiconductor device being made in a state of being insulated from the terminal by being arranged so as not to overlap two-dimensionally with the terminal and the terminal and an oscillating circuit terminal of the semiconductor device connected by wire-bonding.

5. The piezoelectric oscillator according to claim 1, the piezoelectric oscillator being resin molded except a region at the center part of the lid body of the resonator package.

6. A portable telephone unit applying a piezoelectric oscillator, comprising:
   a resonator package accommodating a piezoelectric resonating element in the resonator package; and
   a semiconductor device fixed onto a rear surface of the resonator package and having a built-in oscillating circuit, the portable telephone unit obtaining a control clock signal by the piezoelectric oscillator, in which an inner lead portion of a lead frame being fixed onto the rear surface of the resonator package and the resonator package and the semiconductor device being resin molded except an outer lead portion of the lead frame, the inner lead portion and the semiconductor device connected by wire bonding,
   on the rear surface of the resonator package, a terminal connected to the piezoelectric resonating element accommodated in the resonator package being provided, the inner lead portion connected to the semiconductor device being fixed in a state of being insulated from the terminal and the terminal connected to the piezoelectric resonating element and an oscillating circuit terminal of the semiconductor device connected by wire-bonding,
   a terminal of the semiconductor element connected to the inner lead portion and a terminal of the semiconductor element connected to a terminal connected to the piezoelectric oscillation piece are arranged on a surface opposite to a surface joining the resonator package of the semiconductor device.

7. Electronic equipment applying a piezoelectric oscillator, comprising:
   a resonator package accommodating a piezoelectric resonating element in the resonator package, and
   a semiconductor device fixed onto a rear surface of the resonator package and having a built-in oscillating circuit, the electronic equipment obtaining a control clock signal by the piezoelectric oscillator, in which an inner lead portion of a lead frame being fixed onto the rear surface of the resonator package and the resonator package and the semiconductor device being resin molded except an outer lead portion of the lead frame, the inner lead portion and the semiconductor device connected by wire bonding,
   on the rear surface of the resonator package, a terminal connected to the piezoelectric resonating element accommodated in the resonator package being provided, the inner lead portion connected to the semiconductor device being fixed in a state of being insulated from the terminal and the terminal connected to the piezoelectric resonating element and an oscillating circuit terminal of the semiconductor device connected by wire-bonding,
   a terminal of the semiconductor element connected to the inner lead portion and a terminal of the semiconductor element connected to a terminal connected to the piezoelectric oscillation piece are arranged on a surface opposite to a surface joining the resonator package of the semiconductor device.

* * * * *